United States Patent [19]
Busse-Grawitz et al.

[11] Patent Number: 5,814,992
[45] Date of Patent: Sep. 29, 1998

[54] NMR PROBE HEAD WITH CRYOGENICALLY COOLED PREAMPIFIERS

[75] Inventors: Max Erick Busse-Grawitz, Zumikon; Walter Roeck, Zürich, both of Switzerland

[73] Assignee: Spectrospin AG, Fällanden, Switzerland

[21] Appl. No.: 754,057

[22] Filed: Dec. 3, 1996

[30] Foreign Application Priority Data

Dec. 20, 1995 [EP] European Pat. Off. ............. 95120174

[51] Int. Cl.$^6$ ...................................................... G01N 3/00
[52] U.S. Cl. ............................................. 324/318; 324/322
[58] Field of Search .................................. 324/300, 307, 324/318, 321, 322

[56] References Cited

U.S. PATENT DOCUMENTS

| | | | |
|---|---|---|---|
| 4,051,429 | 9/1977 | Imanari et al. | 324/311 |
| 5,166,620 | 11/1992 | Panosh | 324/322 |
| 5,247,256 | 9/1993 | Marek | 324/321 |
| 5,258,710 | 11/1993 | Black | 324/309 |
| 5,689,187 | 11/1997 | Marek et al. | 324/318 |

FOREIGN PATENT DOCUMENTS 4013111  10/1991  Germany ........................ G01R 33/30

OTHER PUBLICATIONS

The NMR Newsletter, ed. Shapiro, Mar. 1995.
"A High–Resolution NMR Probe in Which the Coil and Preamplifier are Cooled with Liquid Helium" by P. Styles et al. In: Journal of Magnetic Resonance, vol. 60, 1984, pp. 397–404.
"Thin Film High Temperature Superconductor RF Coil and Cryogenic Preamplifier for Low Field MRI" by J.G. Van Heteren et al. In: IEEE Conference, Record, Nuclear Science Symposium & Medical Imaging Conference, vol. 3, 1993, San Francisco, pp. 1708–1712.
"An Improved Cryogenically Cooled Probe for High–Resolution NMR" In: Journal of Magnetic Resonance, vol. 84, 1989, p. 376–378.
Superconductivity News, vol. 7, No. 18, 1995, p. 2. The NMR Newsletter, ed.Shapiro, Mar. 1995.

*Primary Examiner*—Louis M. Arana
*Attorney, Agent, or Firm*—Paul Vincent

[57] ABSTRACT

A nuclear magnetic resonance (NMR) probe head for use in a room temperature bore of a superconducting NMR magnet cryostat for investigation of generally room temperature samples comprises a radio frequency (RF) receiving coil, a receiving coil preamplifier connected to the receiving coil, at least one additional coil and cryogenic means connected to the RF receiving coil, to the receiving coil preamplifier, and to the at least one additional coil for keeping the RF receiving coil, the preamplifier and the additional coil at a cryogenic temperature. The apparatus is improved in that at least one additional preamplifier is connected to the additional coil and to the cryogenic means the cryogenic means keeping the additional preamplifier at a cryogenic temperature. The apparatus exhibits improved performance and increased flexibility.

7 Claims, 4 Drawing Sheets

NMR PROBE HEAD WITH CRYOGENICALLY COOLED PREAMPIFIERS

BACKGROUND OF THE INVENTION

The invention concerns a nuclear magnetic resonance (NMR) probe head for use in a room temperature bore of a superconducting NMR magnet cryostat, the probe head for investigation of generally room temperature samples and comprising a radio frequency (RF) receiving coil, a receiving coil preamplifier connected to the receiving coil, at least one additional coil, and cryogenic means connected to the RF receiving coil, the receiving coil preamplifier and the at least one additional coil for keeping the RF receiving coil, the preamplifier and the additional coil at a cryogenic temperature.

A cryogenic probe head configuration of this type is known in the art from DE 40 13 111 C2. This patent manuscript describes an RF receiver configuration for use in an NMR spectrometer having a room temperature sample which exhibits a cooled RF receiving coil for detection of a nuclear magnetic signal from the sample. The cooling means for the RF receiver coil is effected by means of a heat conducting contact with a cooled plate whereby the RF receiving coil is arranged about the sample in vacuum. The patent discloses an advantageous embodiment in which a semiconducting preamplifier or mixer adapted for receiving the RF coil signals is cooled by helium return gas. The purpose of the configuration of DE 40 13 111 C2 is to generate an RF receiving mechanism which achieves an improved signal to noise ratio at low temperatures by minimizing compromises in the fill factor caused by the utilization of cryogenic cooling means and by reducing vibrations associated with the flow of cooling fluids in the probe head while maintaining good cooling action. An additional cooling of the preamplifier can increase the overall signal to noise ratio of the receiving system.

In addition, this publication mentions the possibility of cooling a second RF transmitter coil arranged outside and in the vicinity of the first receiving coil to helium-like temperatures in order to reduce heat losses which would otherwise occur due to radiative coupling between such a warm outer RF transmitting coil and the cooled inner receiving coil. In this fashion the helium requirements during use of the inner receiving coil are reduced and the outer transmitting coil, through cooling, essentially serves the function of an additional radiation shield for the inner coil.

The Journal of Magnetic Resonance 60, pages 397–404 (1984) discloses a cooled NMR probe head in which both the receiver coil and its preamplifier are enclosed in a cryostat and cooled with liquid helium. In this publication the samples are at room temperature. In this arrangement, the noise which originally is predominantly caused by the resistance and warmth of the receiver coil is significantly improved by cooling the coil to cryogenic temperatures so that substantial improvements in sensitivity are achieved. This improvement is generally not limited by the performance of the preamplifier which is designed to match the coil performance. In this publication carbon-13 spectra taken at 45 MHz demonstrate improved sensitivity over conventional probes at the same field strength. In general an improvement between factors of 2.5 to 4 is achieved in the configuration according to this publication. This improvement, although significant, is nevertheless substantially less than the theoretical 25-fold improvement due to the reductions in the theoretical noise of the coil alone expected at helium temperatures.

The Journal of Magnetic Resonance 84, pages 376–378 (1989) discloses an improved cryogenically cooled probe head for high resolution NMR. In this publication the authors cool the NMR coil to liquid helium temperatures by means of a continuous flow cryostat rather than a bath cryostat. As a result, the probe head size is reduced and is similar in size to a conventional probe. In this manner the fill factor of the probe head is improved so that, in principle, results closer to the theoretical maximum can be achieved. In this publication the preamplifier is not cooled to liquid helium temperatures, rather is located outside of the liquid helium cryostat and cooled in a bath of liquid nitrogen.

The journal "Superconductivity News" Volume 7, number 18, 1995, page 2 reports an announcement by Bruker Instruments Incorporated (Billerica, Mass., USA) made at the ENC-meeting in Boston, Mass. 1995 in which a cryogenic probe head comprising a 5 mm 1H probe including a lock and operating below 20° Kelvin for high resolution samples is introduced. The samples themselves are liquid at room temperature. The reported device features an integrated cooled preamplifier which fits into the standard bore of a 15 MHz 54 mm magnet and exhibits signal to noise ratio improvements of approximately a factor 3.

In "The NMR Newsletter", Palo Alto, Calif., Editor Dr. B. L. Shapiro, Mar. 20th, 1995, Varian Associates INC. reported a superconducting high resolution probe head utilizing coils cooled to 25° Kelvin using flowing helium in which an approximately three-fold improvement in signal to noise ratio over that achieved in a conventional probe head was achieved. A preamplifier cooled to liquid nitrogen temperatures was coupled to the RF receiver coil for amplifying the detected signals.

In view of the above described characteristics and properties of cryogenic probe heads of prior art, it is the purpose of the present invention to develop a probe head suitable for use with a cryogenic receiver coil which exhibits improved performance not only for the primary proton signal, but for secondary signals as well.

SUMMARY OF THE INVENTION

This purpose is achieved in accordance with the invention by including at least one additional preamplifier connected to the additional coil and to the cryogenic means, the cryogenic means keeping the additional preamplifier at a cryogenic temperature.

The signal to noise ratio (=SNR) of an NMR-detection system is primarily determined by the sensitivity and the temperature of the NMR receiving coil, secondarily by the noise figure (or noise temperature) of the preamplifier and last by the noise of the remaining components of the detection system, whereby the term "noise level" used herein indicates the noise level in the frequency domain. Receiving coils which are not cryogenically cooled have generally higher noise levels than that of an uncooled preamplifier so that the receiving coil defines the SNR of the entire detection system and the preamplifier need not be cooled to cryogenic temperatures. However, if the receiving coil is cooled to cryogenic temperatures, its noise level decreases such that the noise level of the preamplifier increasingly defines the SNR of the entire detection system. In accordance with the invention the SNR of the entire detection system is increased by providing cryogenic cooling means for the preamplifiers connected electrically to the primary receiving coil and to the additional coil.

This improved performance permits significant increases in the flexibility and range of application for the additional coil as well as improving its performance for its originally intended purpose. In contrast to prior art, in particular the prior art associated with DE 40 13 111, the cooling of the additional coil is not only effected in order to provide radiation shielding for the inner high-sensitivity coil, but is also utilized, in conjunction with the cooled additional coil preamplifier in accordance with the invention, to improve the overall SNR of the additional receiving system and in this way allow for applications which would otherwise not be possible.

In a particularly preferred embodiment the additional preamplifier is adapted for preamplifying a lock signal. This measure has the advantage that the noise of the lock signal is substantially reduced so that the static magnetic field becomes more stable and/or less lock material substance is necessary.

In another embodiment, the cryogenic means comprise liquid helium means for cooling the receiving coil and the additional coil as well as liquid nitrogen means and/or evaporated helium gas means for cooling the receiving coil preamplifier and additional coil preamplifier. This measure has the advantage that extremely low temperatures can be utilized for decreasing the substantial noise contribution due to the receiving coil and the additional coil, whereas less expensive and simpler cooling means using liquid nitrogen and/or evaporated helium gas can be utilized for reducing the noise of the preamplifiers. In this manner the liquid helium usage is reduced and improved access to the preamplifiers is guaranteed without substantially sacrificing signal-to-noise ratio.

In an embodiment of the invention the liquid nitrogen and/or evaporated helium gas means are adapted for cooling the coil filters and/or the transmitter/receiver switches. This measure has the advantage of further reducing noise contributions to the system from other system components.

In a further particularly preferred embodiment a plurality of additional preamplifiers are provided, with each additional preamplifier preamplifying an NMR signal having a particular resonant frequency. This measure has the advantage of providing simultaneously a plurality of possible signal channels in a single probe head exhibiting improved signal-to-noise ratios which are comparable to or better than those of conventional dedicated probe heads. This allows, in turn, for additional experiments at various frequencies on different nuclear spins to be carried out without changing the probe head.

Therefore, a single additional coil can be connected and matched simultaneously or successively to a plurality of additional preamplifiers, the additional preamplifiers being tuned, together with the additional coil, to respond to one or more appropriate resonant frequencies of additional nuclear spins. In this manner it is possible to use the additional coil in an optimal and variable fashion for the measurement of a plurality of different nuclear spins.

The loss in sensitivity due to the fact that the additional coil is further away from the sample and therefore has a poorer sensitivity compared to the receiving coil can be compensated for by the cooling of the additional coil as well as of the preamplifier and by the close proximity of the preamplifier to the additional coil.

In an additional improvement of this latter embodiment, the additional preamplifiers are adapted for preamplifying a 2H, 13C, 31P and/or a 15N signal. This improvement has the advantage that the deuterium signal utilized for the lock or signals from carbon 13, phosphorous 31, or nitrogen 15, which are often used in NMR applications, can be measured using the probe head configuration in accordance with the invention at improved signal-to-noise corresponding to or exceeding those of a conventional dedicated probe head. In this manner measurements of these additional nuclei can be carried out with a much better result in quality and without having to change the probe head.

In a further embodiment of the invention, a stacking module provides for stacking the receiving coil preamplifiers and the additional coil preamplifiers. This measure has the advantage that a compact configuration for the preamplifiers is achieved which is easily cooled in an effective manner.

In an improvement of this embodiment the stacking modules comprise copper or aluminum blocks in good thermal contact with the receiving coil preamplifier and the additional coil preamplifier. This measure has the advantage that good thermal contact and cooling of the preamplifiers is guaranteed in a manner which effectively utilizes the cooling capabilities of the cryogenic fluid.

In a preferred embodiment of the invention the receiving coil and/or the at least one additional coil also functions as a transmitting coil and switching means are provided for disconnecting the receiver and/or the additional coil from the receiving coil preamplifier and/or the additional coil preamplifier and for connecting the receiver coil to a transmitter and/or the additional coil to an additional coil transmitter.

In this way, coils in close proximity to the sample and therefore having good preconditions for best performance can be used not only for obtaining an optimal SNR in the receiving mode but also for obtaining the highest degree of effectiveness in the transmitting mode.

In a further embodiment of the invention the probe head comprises two coils, the receiver coil and the additional coil, decoupled from each other by appropriate geometrical arrangement, wherein the receiver coil is orthogonal to the additional coil. In this manner a reduction in signal coupling by approximately 40 dB can be achieved. This measure has the advantage that both coils can be tuned to frequencies close to each other without significant mutual interference. Both coils can be used for receiving as well as for transmitting.

In accordance with the invention, both the receiver coil as well as the additional coil can be tuned to a plurality of frequencies and be connected to a plurality of preamplifiers. Multiple configurations of this type can be utilized for the receiver coil alone, for the additional coil or for both. A possible configuration of the receiver coil is for this coil to be tuned to both 1H as well as 2H signals and permanently connected to two preamplifiers.

In the following the invention is described in more detail with reference to the drawings. The above mentioned features and those which are to be described in greater detail below can be used not only in the corresponding combination given but also in other combinations or individually without departing from the framework of the current invention.

BRIEF DESCRIPTION OF THE DRAWINGS

FIG. 3b shows a plan view through a cut IIIb—IIIb of FIG. 3a.

BRIEF DESCRIPTION OF THE PREFERRED EMBODIMENTS

Figure 1:
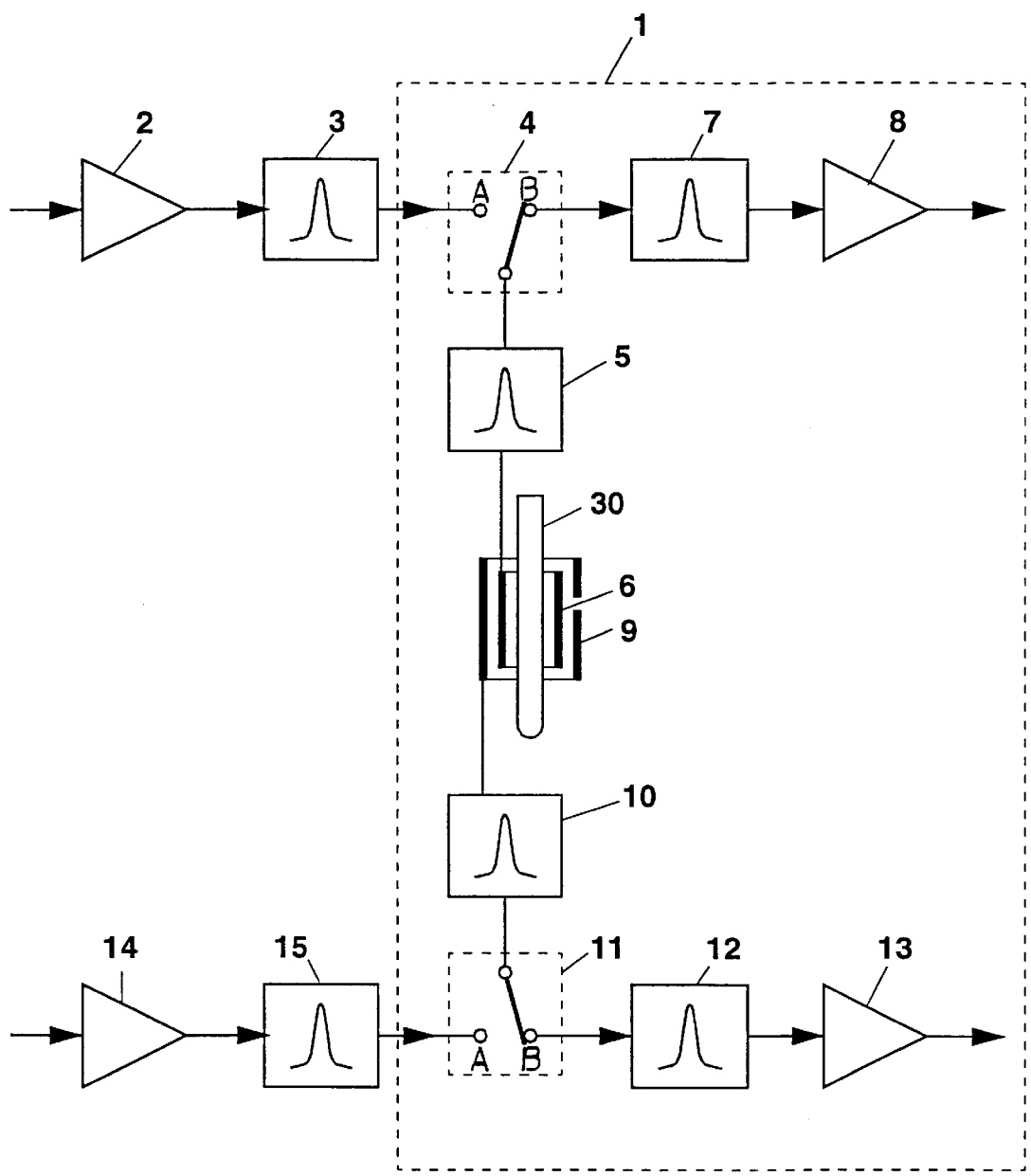
FIG. 1 shows a schematic block diagram of a first embodiment of the probe head in accordance with the invention.

FIG. 1 shows a first embodiment of an NMR probe head 1 in accordance with the invention. The probe head 1 receives radio frequency excitation signals for excitation of proton nuclear spins by means of 1H transmitter 2. The radio frequency signals generated by the 1H transmitter 2 are fed to a 1H transmitter filter 3 for preparation for transmission into the integrated probe head 1. Upon entering the probe head 1 the signals from the 1H transmitter filter 3 enter into a 1H transmitter/receiver switch 4. The 1H transmitter/receiver switch 4 is switched to the transmitter mode (position A) when transmitting signals from the 1H transmitter 2 into the probe head 1.

After passing through the 1H transmitter/receiver switch 4 the signals are tuned and matched to 1H coil 6 using 1H coil filter 5. The 1H coil 6 is located surrounding a sample 30 which is at room temperature and thermally isolated from coils 6 and 9 using vacuum as isolator, not shown in the figure. The 1H transmitter 2, 1H transmitter filter 3, 1H transmitter/receiver switch 4, 1H coil filter 5 and 1H coil 6 are adapted for excitation of protons in the sample 30. The nuclear magnetic resonant signal coming from relaxing proton spins in the sample 30 is detected by the 1H coil 6 and passes once more through 1H coil filter 5 before entering the 1H transmitter/receiver switch 4. In the receiving mode (position B), the 1H transmitter/receiver switch 4 is switched to pass signals from the 1H coil filter 5 to a 1H preamplifier filter 7. The 1H preamplifier filter 7 is used for filtering and impedance matching and transmits the signals in an optimalized fashion to the 1H preamplifier 8.

Surrounding the 1H coil 6 of FIG. 1, is a 2H coil 9. The 2H coil 9 is adapted for detecting deuterium signals for monitoring locking and for stabilizing the magnetic field in order to achieve a stable NMR spectrum. The signals detected by the 2H coil 9 are passed via a 2H coil filter 10 and a 2H transmitter/receiver switch 11 to a 2H preamplifier filter 12 and finally to the 2H preamplifier 13. In a receiving mode the 2H transmitter/receiver switch 11 is in position B and set to pass the 2H signals from the 2H filter 10 to the 2H preamplifier filter 12. In an alternative transmitting mode the 2H transmitter/receiver switch 11 is in position A and switched to the 2H transmitter filter 15 for accepting signals from the 2H transmitter 14. In this mode the 2H excitation signals emanating from the 2H transmitter 14 are passed by the 2H transmitter/receiver switch 11 to the 2H coil 9 for excitation of the 2H lock substance in the sample region.

Figure 2:
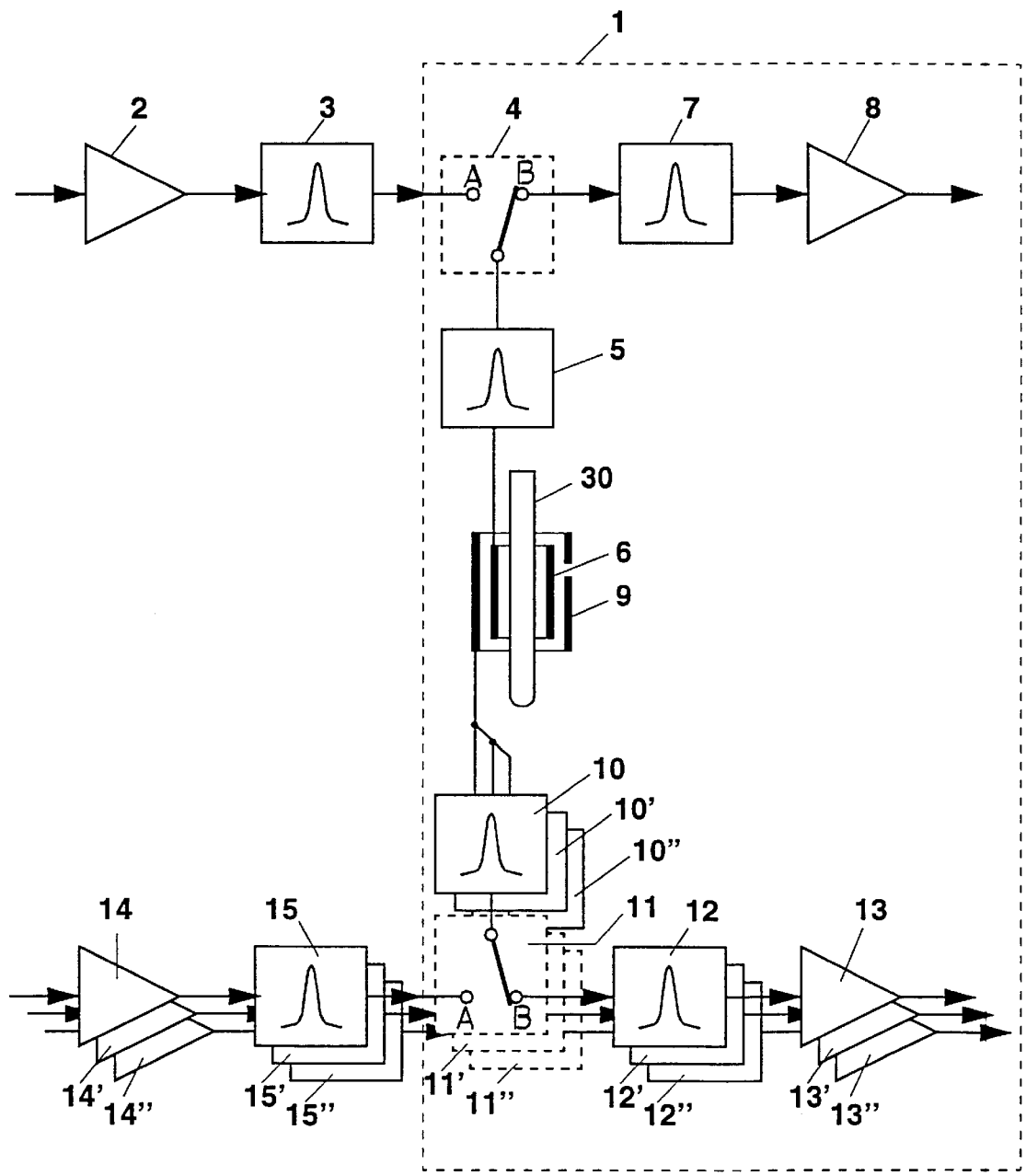
FIG. 2 shows a simplified block diagram similar to that of FIG. 1 but for a second embodiment of the probe head in accordance with the invention.

FIG. 2 shows an embodiment of the invention similar to that of FIG. 1. Reference symbols in FIG. 2 which are the same as those of FIG. 1 correspond to the same elements. In the embodiment of FIG. 2, however, additional elements are present. This embodiment comprises a plurality of coil filters 10, 10', 10". Additional coil filter 10' can be a 15N coil filter which is adapted for detecting and passing resonance frequencies corresponding to those of 15N. The 15N signals passing through the 15N coil filter 10' are fed through a 15N transmitter/receiver switch 11'. In the detection mode the 15N transmitter/receiver switch 11' is set to transmit those detection signals from 15N passing through the 15N coil filter 10' to a 15N preamplifier filter 12'. The 15N preamplifier filter 12' is tuned to pass frequencies corresponding to the 15N signals to a 15N preamplifier 13'.

Analogous thereto, FIG. 2 also shows an additional channel which could be used for 13C. A 13C coil filter 10" is adapted for passing 13C signals from the sample 30 through an appropriately tuned 13C transmitter/receiver switch 11" to a 13C preamplifier filter 12". The 13C signals transmitted thereby are fed into a 13C preamplifier 13".

In the embodiment according to FIG. 2 a single additional coil 9 is provided both for excitation as well as for receiving the signals from the sample 30. In the excitation or transmission mode the 15N excitation radio frequencies are generated in a 15N transmitter 14' and fed to a 15N transmitter filter 15' before entering the 15N transmitter/receiver switch 11'. In the transmission mode the 15N transmitter/receiver switch 11' is set to transmit 15N signals from the 15N transmitter 14' to the 15N coil filter 10'.

The embodiment of FIG. 2 also exhibits an additional channel for 13C signals in which the 13C signals are generated in a 13C transmitter 14", passed through a 13C transmitter filter 15" and sent via a 13C transmitter/receiver switch 11" to the 13C coil filter 10" before gaining access to the additional transmitter/receiver coil 9.

Figure 3A:
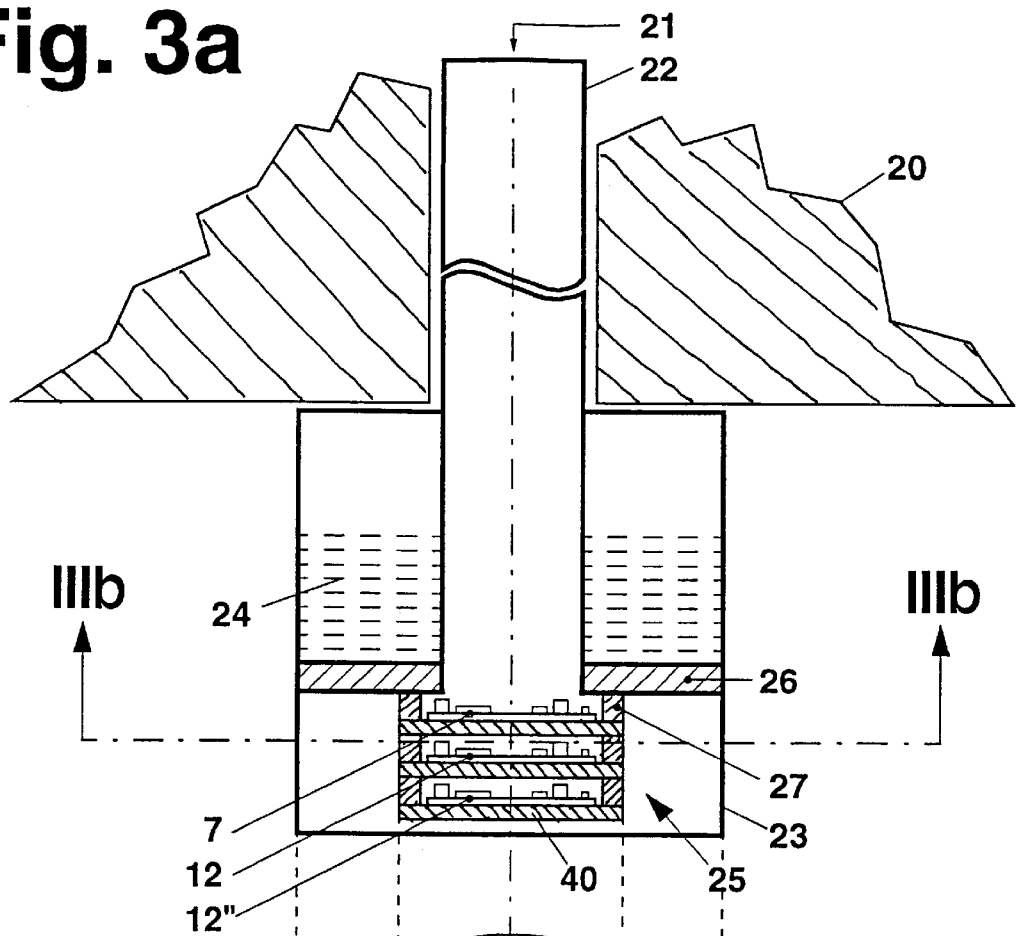
FIG. 3a shows a cross-sectional view of a probe head in accordance with the invention.

FIG. 3a shows a cross-sectional cut through a part of a probe head 21 in accordance with the invention. The probe head 21 in FIG. 3a exhibits an upper probe head section 22 and a lower probe head section 23. Surrounding the probe head 21 is a superconducting magnet 20. A liquid nitrogen (LN2) bath 24 is arranged in the lower probe head section 23. In thermal contact with the liquid nitrogen bath 24 is a stacking module 25. The stacking module 25 comprises a copper plate 26 and copper blocks 27. The copper plate 26 and copper blocks 27 are adapted for good thermal contact to a 1H preamplifier 7, a 2H preamplifier 12, and a 13C preamplifier 12".

Figure 3B:
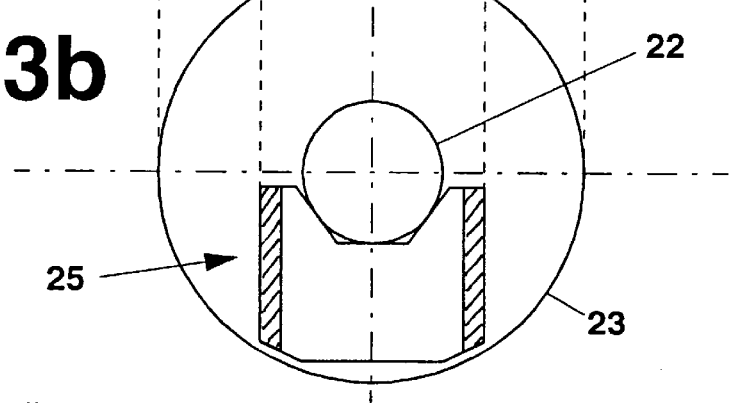

FIG. 3b shows a cut indicated in FIG. 3a as IIIb—IIIb for a plan view of a cross-section thereof. In the cross-section of FIG. 3b the upper probe head casing 22 is visible as is the lower probe head outline 23 and the stacking module 25. The stacking module 25 is arranged at the sideward position of the probe head 21 in the embodiment of FIGS. 3a and 3b.

Figure 4:
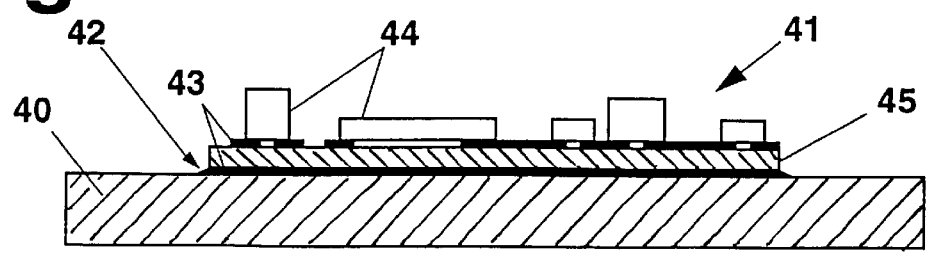
FIG. 4 shows an enlarged view of a section of a copper support and preamplifier printed circuit board in accordance with the invention.

A particular embodiment for the configuration of a cooled preamplifier unit is shown in FIG. 4. In this embodiment a copper support plate 40 serves as a base structure for a preamplifier 41.

The preamplifier 41 consists of electronic components 44 mounted on a printed circuit 45 having copper coatings 43 on both surfaces. The lower coating 43 of the printed circuit 45 is soldered to the copper support plate 40 in order to produce a good thermal contact 42 between these two objects. The support plate 40 is cooled down to cryogenic temperatures, and because the preamplifier is in good thermal contact with the support plate 40, it will also reach cryogenic temperatures.

Figure 5:
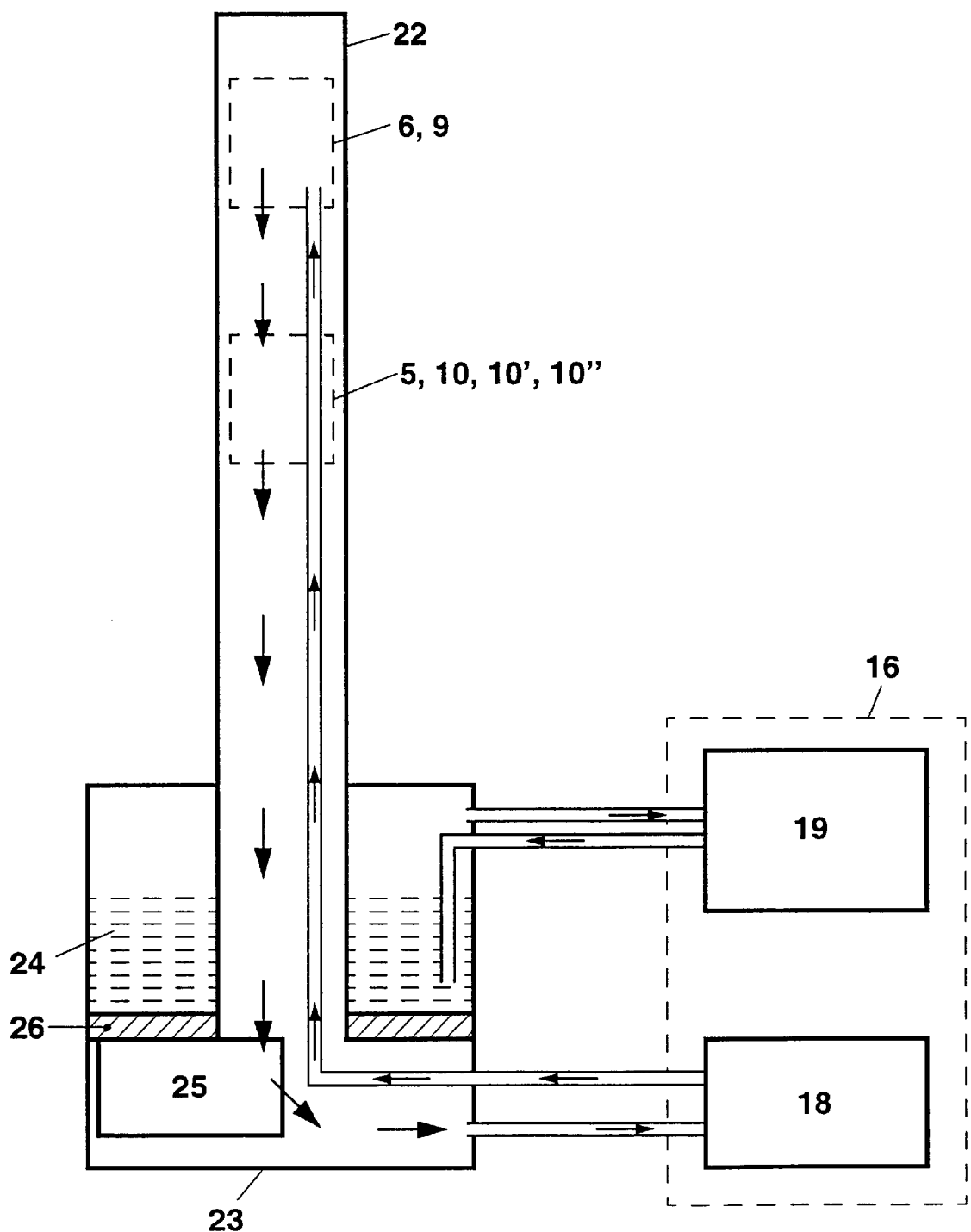
FIG. 5 shows a cross-sectional view of the probe head in accordance with the invention similar to FIG. 3a but schematically showing cooling functions in accordance with the invention.

FIG. 5 shows, in accordance with the invention, cryogenic means 16 integrated into the lower probe head section 23. The cryogenic means 16 exhibit, in the embodiment in accordance with FIG. 5, liquid helium means 18 connected to the region containing the receiving coil 6 and the additional coil 9. The liquid helium means 18 are adapted for cooling the receiving coil 6 and the additional coil 9 to temperatures approaching those of liquid helium. In so doing, the liquid helium evaporates into helium gas which, in turn, is used for cooling the coil filters 5, 10, 10' and 10".

The cryogenic means 16 additionally exhibit liquid nitrogen means 19 connected to the liquid nitrogen bath 24 which is thermally connected via copper plate 26 to the stacking module 25 containing the preamplifiers 8, 13, 13' and 13". In this way these preamplifiers are cooled to temperatures approaching those of liquid nitrogen.

Although, in this embodiment, the liquid helium means 18 are connected to the coils 6, 9 and the liquid nitrogen means 19 to the preamplifiers 8, 13, 13', 13", other embodiments are possible in which the liquid helium means 18 are also connected to one or more preamplifiers 8, 13, 13', 13" or in which evaporating helium gas generated in the probe head 21 or coming from the liquid helium means 18 is passed through one or more preamplifiers 8, 13, 13', 13" for cooling.

The cooling of the coils 6, 9 by liquid helium means 18 can, as is known in the art, transpire by flow-through cooling or by thermal contact with a helium bath or with a cooling member in contact therewith.

We claim:

1. A nuclear magnetic resonance (NMR) probe head for use in a room temperature bore of a superconducting NMR magnet cryostat to investigate a room temperature sample comprising:

a radiofrequency (RF) receiving coil surrounding the sample;

a receiving coil preamplifier connected to said receiving coil;

an additional coil surrounding said receiving coil;

an additional coil preamplifier connected to said additional coil;

cryogenic means connected to said receiving coil, said receiving coil preamplifier, said additional coil and said additional coil preamplifier for keeping said receiving coil, said receiving coil preamplifier, said additional coil and said additional coil preamplifier at a cryogenic temperature, said cryogenic means comprising liquid helium means for cooling said receiving coil and said additional and at least one of liquid nitrogen means and evaporated helium gas means for cooling said receiving coil preamplifier and said additional coil preamplifier; and a coil filter and a transmitter-receiver switch, wherein at least one of said liquid nitrogen means and said evaporated helium gas means are adapted for cooling said coil filter and said transmitter-receiver switch.

2. A nuclear magnetic resonance (NMR) probe head for use in a room temperature bore of a superconducting NMR magnet cryostat to investigate a room temperature sample comprising:

a radiofrequency (RF) receiving coil surrounding the sample;

a receiving coil preamplifier connected to said receiving coil;

an additional coil surrounding said receiving coil;

a plurality of additional coil preamplifiers, each additional coil preamplifier for preamplifying an NMR signal having a particular resonant frequency;

means for connecting each of said plurality of additional coil preamplifiers to said additional coil; and cryogenic means connected to said receiving coil, said receiving coil preamplifier, said additional coil and said plurality of additional coil preamplifiers for keeping said receiving coil, said receiving coil preamplifier, said additional coil and said plurality of additional coil preamplifiers at a cryogenic temperature.

3. The probe head of claim 2, wherein said additional coil preamplifiers are adapted for preamplifying at least one of a 2H, 13C, 31P, and a 15N signal.

4. The probe head of claim 2, further comprising a stacking module for stacking said receiving coil preamplifier and said additional coil preamplifier.

5. The probe head of claim 4, wherein said stacking module comprises copper blocks in good thermal contact with said receiving coil preamplifier and said additional coil preamplifier.

6. The probe head of claim 2, wherein at least one of said receiving coil and said additional coil are adapted to also function as a transmitting coil and further comprising transmitting switching means for disconnecting at least one of said receiving coil and said additional coil from said receiving coil preamplifier and from said plurality of additional coil preamplifiers and for connecting said receiving coil to a transmitter and said additional coil to an additional coil transmitter.

7. The probe head of claim 2, wherein said receiving coil and said additional coil are decoupled from each other by appropriate geometrical arrangement.

\* \* \* \* \*

UNITED STATES PATENT AND TRADEMARK OFFICE
CERTIFICATE OF CORRECTION

PATENT NO. : 5,814,992
DATED : September 29, 1998
INVENTOR(S) : Max Erick Busse-Grawitz, Walter Roeck It is certified that error appears in the above-identified patent and that said Letters Patent is hereby corrected as shown below:

On the title page, item [54] correct in the title "PREAMPIFIERS" with --PREAMPLIFIERS--

Signed and Sealed this

Twenty-third Day of February, 1999

Q. TODD DICKINSON

Attest:

Attesting Officer

Acting Commissioner of Patents and Trademarks